US009059703B2

(12) United States Patent
Shoji et al.

(10) Patent No.: US 9,059,703 B2
(45) Date of Patent: Jun. 16, 2015

(54) SWITCH CIRCUIT

(71) Applicant: Kabushiki Kaisha Toshiba, Tokyo (JP)

(72) Inventors: Masatsugu Shoji, Tokyo (JP); Kenji Kanamaru, Kanagawa (JP); Masayoshi Takahashi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/155,104

(22) Filed: Jan. 14, 2014

(65) Prior Publication Data

US 2015/0061748 A1 Mar. 5, 2015

(30) Foreign Application Priority Data

Aug. 29, 2013 (JP) ................................ 2013-178093

(51) Int. Cl.
*H03K 17/687* (2006.01)
*B23K 11/24* (2006.01)
*H03K 17/16* (2006.01)

(52) U.S. Cl.
CPC ................... *H03K 17/165* (2013.01)

(58) Field of Classification Search
USPC ......... 327/108–112, 103, 427, 434, 437, 365, 327/374–391, 403–405, 407–413, 415–417, 327/419; 323/272; 326/82, 83
See application file for complete search history.

(56) References Cited

U.S. PATENT DOCUMENTS

| | | | |
|---|---|---|---|
| 5,969,514 A * | 10/1999 | Merrill | 323/283 |
| 6,469,480 B2 | 10/2002 | Kanakubo | |
| 6,621,255 B2 * | 9/2003 | Telefus | 323/272 |
| 7,271,613 B1 * | 9/2007 | La Fetra et al. | 326/30 |
| 7,786,713 B2 | 8/2010 | Kimura | |
| 7,969,130 B2 * | 6/2011 | Vorenkamp | 323/272 |
| 8,170,500 B2 | 5/2012 | Seshita et al. | |
| 2010/0277141 A1 * | 11/2010 | Sutardja | 323/234 |

FOREIGN PATENT DOCUMENTS

| | | |
|---|---|---|
| JP | 2001282371 A | 10/2001 |
| JP | 2007011947 A | 1/2007 |
| JP | 2008083831 A | 4/2008 |
| JP | 2010009547 A | 1/2010 |
| JP | 2012243193 A | 12/2012 |

* cited by examiner

*Primary Examiner* — Lincoln Donovan
*Assistant Examiner* — Thomas Skibinski
(74) *Attorney, Agent, or Firm* — Patterson & Sheridan, LLP

(57) ABSTRACT

A switching circuit includes a plurality of switching elements connected between an input node and an output node and each comprising a first and second electrode connected to the input node and output node, respectively. The switching elements include a control electrode for controlling electrical conductance between the first and second electrodes such the switching element can be switched between an ON conductance state and an OFF conductance state. A detection circuit in the switching circuit outputs a detection value corresponding to an output current at the output node. A control circuit changes the conductance state of at least one switching element such that the summed total of the parasitic capacitances of all switching elements in the ON state decreases as the output current decreases as indicated by the detection value.

9 Claims, 4 Drawing Sheets

SWITCH CIRCUIT

CROSS-REFERENCE TO RELATED APPLICATION

This application is based upon and claims the benefit of priority from Japanese Patent Application No. 2013-178093, filed Aug. 29, 2013, the entire contents of which are incorporated herein by reference.

FIELD

Embodiments described herein relate to a switch circuit.

BACKGROUND

A load switch (hereinafter referred to as "switch circuit") used in electronic equipment or the like may be provided between a power source and a load. The switch circuit may be switched between an ON state and an OFF state. The load may be a CPU, a memory unit, a camera, an electronic device, or the like, for example.

In such a switch circuit, a MOSFET (MOS transistor) having a low ON-state resistance, but which still meets maximum device current requirements, is often used as a switching element. A source of the MOSFET is connected to a power source, and a drain of the MOSFET is connected to the load. The switch is not always operating at the maximum possible device current level, that is, there may be cases when the current level is below the maximum operating capabilities of the MOSFET switch. In such a condition, there may arise a state where a minute current flows into the MOSFET depending on an operation state of the load (that is, the impedance of the load). In such a case, when the switch circuit is switched to an OFF state from an ON state, then a source voltage and a drain voltage of the MOSFET are at a power source voltage and a gate voltage is raised from 0V to the power source voltage such that the MOSFET may be turned off (placed in an OFF state), but because an output current which flows into the load is small, it takes a relatively long time to discharge a residual charge which is stored as a parasitic capacitance between the gate and the drain of the MOSFET. Accordingly, an output voltage of the switch circuit, which is the drain voltage of the MOSFET, transiently becomes greater than the gate voltage (power source voltage) by the voltage at both ends of the parasitic capacitance and hence, the output voltage from the switch becomes larger than the power source voltage during the transition period after switching states are changed. Accordingly, there exists a possibility that the load is erroneously operated because the output voltage temporarily exceeds the power source voltage.

DETAILED DESCRIPTION

According to an embodiment, there is provided a switch circuit which can suppress an increase of an output voltage when the switch circuit is switched from an ON state to an OFF state regardless of an operation state of a load.

In general, according to one embodiment, a switching circuit includes a plurality of switching elements (e.g., transistors) connected between an input node and an output node. The input node may be connected to, for example, a power source/supply. The output node may be connected to a load, such as an electronic device, for example. Each switching element comprises a first (e.g., source terminal) electrode and second (e.g., drain terminal) electrode connected to the input node and output node, respectively. The switching elements each include a control electrode for controlling electrical conductance between the first and second electrodes such the switching element can be switched between an ON conductance state and an OFF conductance state. A detection circuit in the switching circuit outputs a detection value (e.g., a voltage difference between the input and output nodes) corresponding to an output current at the output node. A control circuit changes the conductance state of at least one switching element in the plurality of switching elements such that the summed total of the parasitic capacitances of all switching elements in the ON state decreases as the output current decreases as indicated by the detection value. The control circuit may also be configured to change the conductance state of at least one switching element such that the summed total of the parasitic capacitances of all switching elements in the ON state increases as the output current increases. Hereinafter, an example embodiment is explained by reference to attached drawings. This embodiment is for purposes of explanation and should not be considered as limiting the present disclosure.

Figure 1:
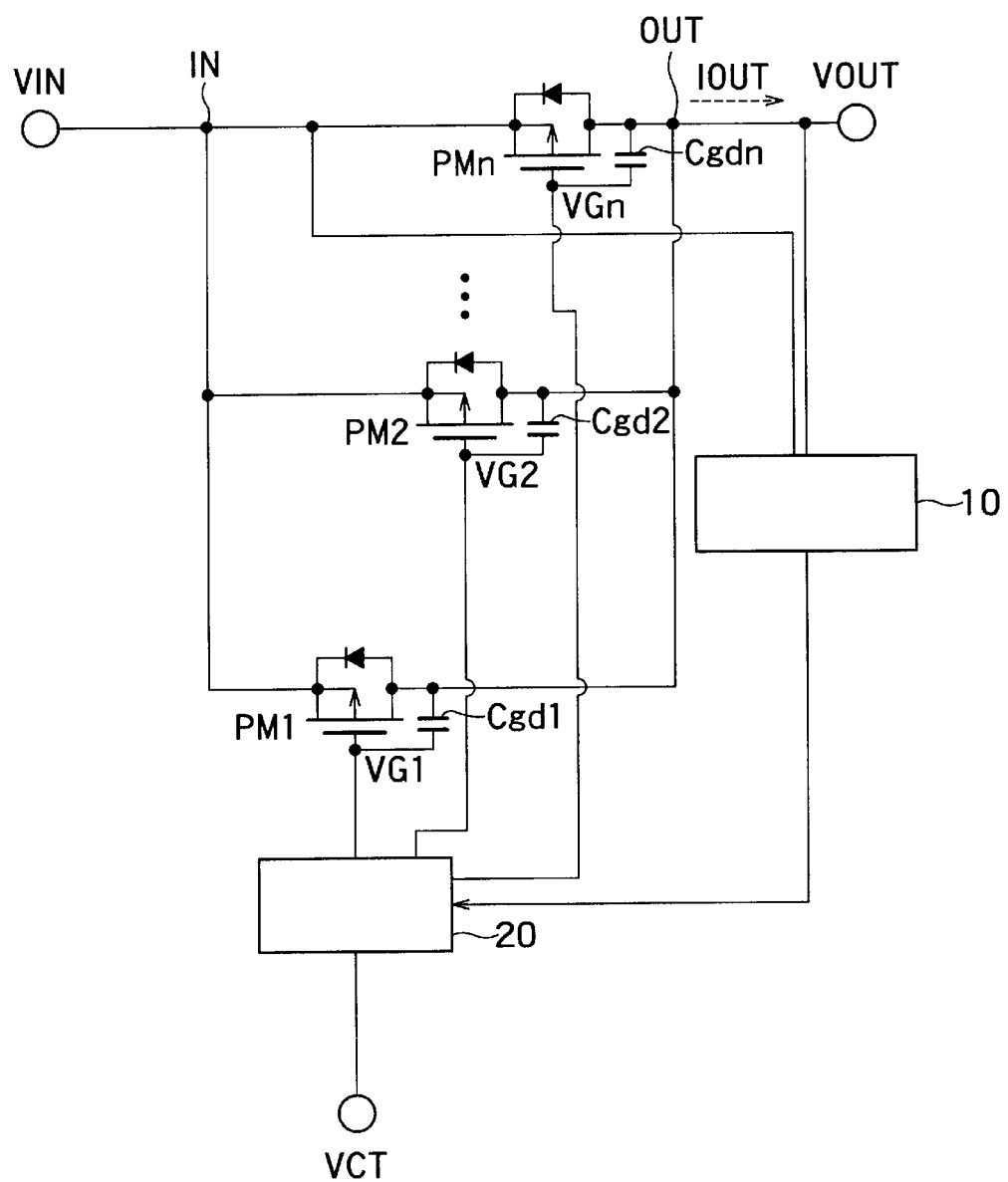
FIG. 1 is a block diagram of a switch circuit according to one embodiment.

FIG. 1 is a block diagram of a switch circuit according to one embodiment. As shown in FIG. 1, the switch circuit includes: a plurality of P-type MOS transistors (switching elements) PM1 to PMn, a detection circuit 10, and a control circuit 20. In FIG. 1, among the plurality of P-type MOS transistors PM1 to PMn, three P-type MOS transistors PM1, PM2, PMn are shown, and other P-type MOS transistors are not specifically depicted in the drawing, but may be included. The switch circuit can be used in portable equipment, such as electronic devices or the like.

Each of the P-type MOS transistors PM1 to PMn includes: a source (first electrode) which is connected to a common input node IN, a drain (second electrode) which is connected to a common output node OUT, and a gate (control electrode) which can be used to control whether or not the transistor is in an ON state, which allows an electric current to flow between the source and the drain. For example, when a relatively low voltage (e.g., 0 V) is applied to the gate electrode of a P-type MOS transistor electrical current may travel between the first electrode and the second electrode (ON state). When a relatively high voltage (e.g., 5 V) is applied to the gate electrode of a P-type MOS transistor electrical current generally does not travel between the first electrode and the second electrode (OFF state).

An input voltage VIN is supplied to the input node IN from an external power source (which is not specifically depicted in FIG. 1).

An external load (not specifically depicted in FIG. 1) is connected to the output node OUT. An impedance of the load may change corresponding to an operating state of the load. The load can be, for example, a CPU, a memory unit, a camera or the like can be used, as may various other electrical and electronic devices or combinations of such devices.

The P-type MOS transistor PM1 has a parasitic capacitance Cgd1 between the gate and the drain thereof, and the P-type MOS transistor PM2 has a parasitic capacitance Cgd2 between the gate and the drain thereof. In the same manner, the P-type MOS transistor PMn has a parasitic capacitance Cgdn between the gate and the drain thereof. Other possible parasitic capacitances in the device such as a parasitic capacitance between the gate and the source are not directly relevant to an operation of the switch circuit according to this embodiment and hence, the illustration and the discussion of other parasitic capacitances are omitted. Hereinafter, "parasitic capacitance" means the parasitic capacitance between the gate and the drain of each of the P-type MOS transistors PM1 to PMn.

The detection circuit 10 detects an output current IOUT which flows into the load from the output node OUT. In this embodiment, the detection circuit 10 provides a detection value corresponding to the output current IOUT. The detection value in this embodiment is the voltage difference between an input voltage VIN at the input node IN and an output voltage VOUT at the output node OUT. In other embodiments, the detection value could result from a direct measurement of the output current at the output node.

The control circuit 20 places at least one of the plurality of P-type MOS transistors PM1 to PMn in an ON state when a control signal VCT (supplied from the outside) is at a predetermined logic value. That is, the switch circuit is controlled to be in an ON state so that there is a conductive path between the input node IN and the output node OUT through the P-type MOS transistor that has been placed in the ON state.

When the control signal VCT is not at the predetermined logic value, the control circuit 20 does switch the plurality of P-type MOS transistors PM1 to PMn (or any one or any subset of the P-type MOS transistors PM1 to PMn) to an ON state. That is, the switch circuit is controlled to be in an OFF state such that there is no conductive path through the switch circuit between the input node IN and the output node OUT.

In this embodiment, it is assumed that the predetermined logic value is "0" (for example, 0V). In this manner, the switch circuit is controlled to be in an ON state or an OFF state in response to the control signal VCT.

The control circuit 20 supplies a gate voltage VG1 to the P-type MOS transistor PM1, supplies a gate voltage VG2 to the P-type MOS transistor PM2 and, in the same manner, supplies a gate voltage VGn to the P-type MOS transistor PMn. The control circuit 20 supplies a gate voltage of 0V (ground voltage) to the P-type MOS transistor when placing the P-type MOS transistor in an ON state, and supplies a gate voltage equal to the input voltage VIN to the P-type MOS transistor when placing the P-type MOS transistor in an OFF state.

The control circuit 20 controls whether or not the respective P-type MOS transistors PM1 to PMn are placed in an ON/OFF state such that the resistance between the input node IN and the output node OUT is increased and the sum of the parasitic capacitances between respective gates and drains of the P-type MOS transistors currently in the ON state is decreased when the output current IOUT is decreased.

The control circuit 20 also controls whether or not respective P-type MOS transistors PM1 to PMn are placed in an ON/OFF state such that the resistance between the input node IN and the output node OUT is decreased and the sum of the parasitic capacitances between respective gates and drains of the P-type MOS transistors currently in the ON state is increased as an output current IOUT is increased.

Next, the operation of the switch circuit is explained for an example embodiment. Hereinafter, for clarifying the explanation, it is assumed that the example switch circuit includes four P-type MOS transistors PM1 to PM4, though it should be clear any plural number of transistors could be used.

Figure 2A:
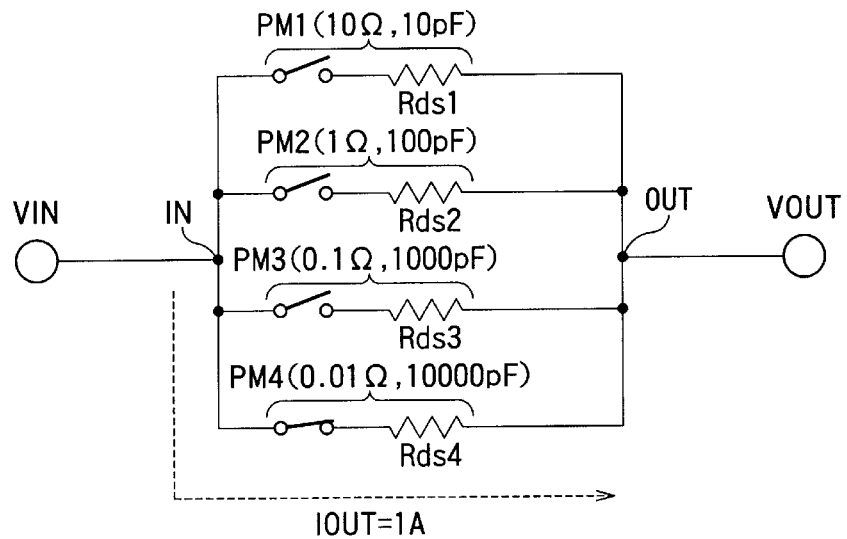
FIG. 2A is an equivalent circuit diagram of a P-type MOS transistor of the switch circuit according to one embodiment when an output current is large.
Figure 2B:
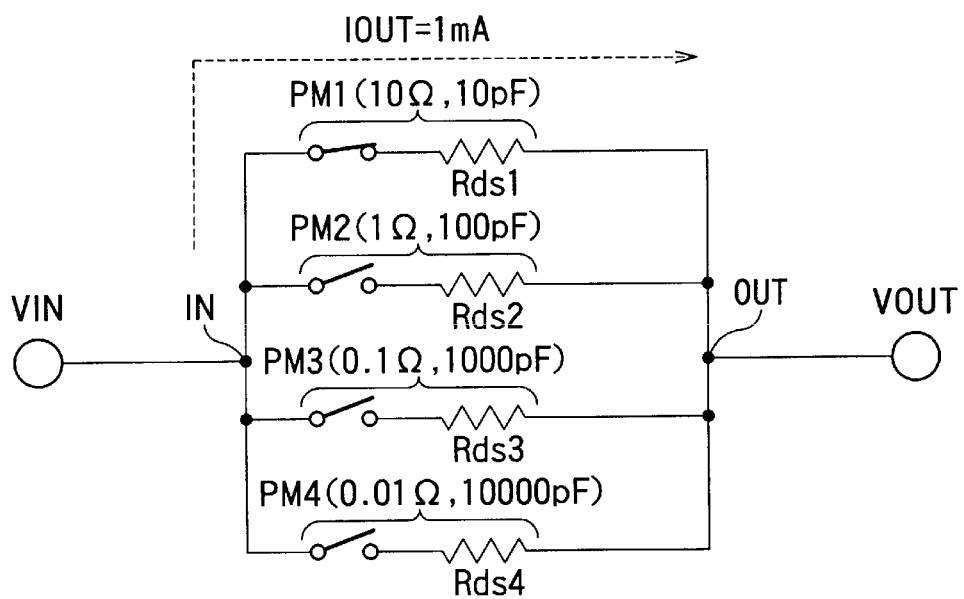
FIG. 2B is an equivalent circuit diagram of the P-type MOS transistor of the switch circuit when an output current is small.

FIG. 2A is an equivalent circuit diagram of the P-type MOS transistors PM1 to PM4 of the switch circuit when an output current IOUT is large, and FIG. 2B is an equivalent circuit diagram of the P-type MOS transistors PM1 to PM4 of the switch circuit when the output current IOUT is small.

As depicted in FIG. 2A and FIG. 2B, the ON resistance Rds1 of the P-type MOS transistor PM1 is 10Ω, and the parasitic capacitance Cgd1 of the P-type MOS transistor PM1 is 10 pF. The ON resistance Rds2 of the P-type MOS transistor PM2 is 1Ω, and the parasitic capacitance Cgd2 of the P-type MOS transistor PM2 is 100 pF. The ON resistance Rds3 of the P-type MOS transistor PM3 is 0.1Ω, and the parasitic capacitance Cgd3 of the P-type MOS transistor PM3 is 1,000 pF, and the ON resistance Rds4 of the P-type MOS transistor PM4 is 0.015, and the parasitic capacitance Cgd4 of the P-type MOS transistor PM4 is 10,000 pF.

In this manner, the ON resistances Rds1 to Rds4 of the P-type MOS transistors PM1 to PM4 differ from each other, and the parasitic capacitances Cgd1 to Cgd4 of the P-type MOS transistors PM1 to PM4 differ from each other. That is, the P-type MOS transistors PM1 to PM4 differ from each other in, for example, size.

Figure 3:
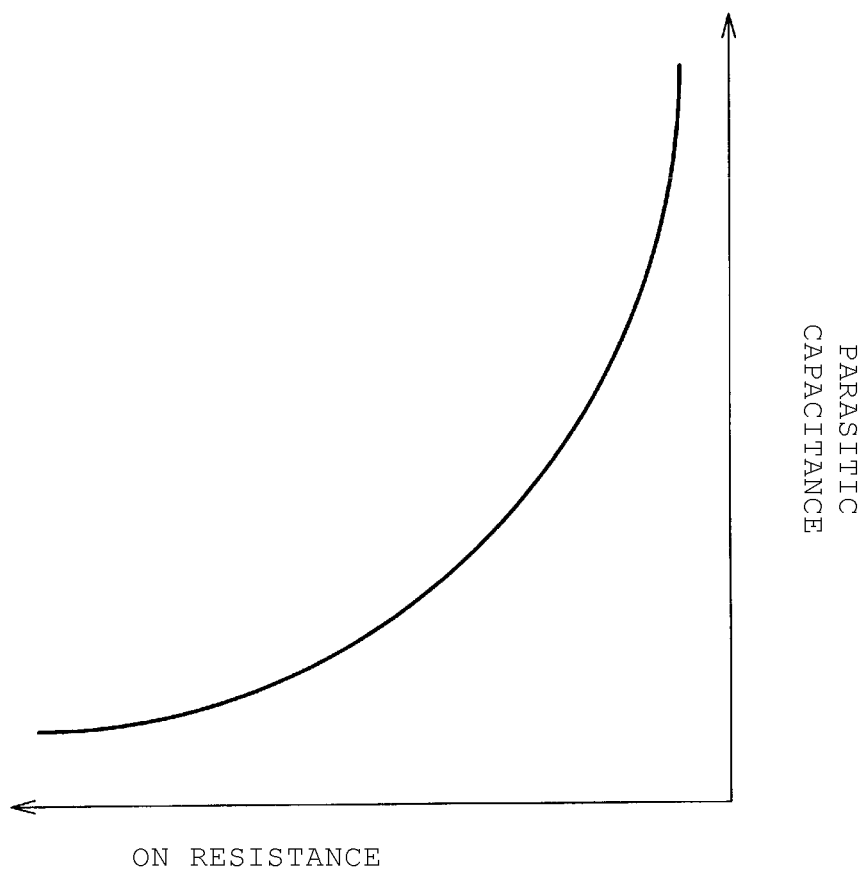
FIG. 3 is a graph showing the relationship between ON resistance and parasitic capacitance of a MOS transistor.

FIG. 3 is a graph showing the relationship between the ON resistance and the parasitic capacitance of a MOS transistor. As shown in FIG. 3, when the ON resistance is decreased by adjusting the size of the MOS transistor, the parasitic capacitance is increased, while when the ON resistance is increased by adjusting the size of the MOS transistor, the parasitic capacitance is decreased. That is, the ON resistance and the parasitic capacitance have a tradeoff relationship. In this embodiment, the ON resistances and the parasitic capacitances of the P-type MOS transistors PM1 to PM4 are set as described above in accordance with such tradeoff relationship.

Next, the operation of the switch circuit when an output current IOUT is decreased at the time of turning on the switch circuit is explained.

Each time the voltage difference detected by the detection circuit 10 is decreased to a first predetermined value (for example, 1 mV), the control circuit can adjust the ON/OFF states of the respective P-type MOS transistors PM1 to PM4 such that the resistance between input and output nodes is increased and the sum of the parasitic capacitances of the respective P-type MOS transistors in the ON state is decreased. In this embodiment, the control circuit 20 places only one P-type MOS transistor in the ON state at a time. That is, in this example, at any given time only one of PM1 to PM4 is the ON state. In other embodiments, the control circuit 20 may place multiple transistors in the ON state at the same time.

Firstly, when a control signal VCT is switched to 0V from 5V, the control circuit 20, as shown in FIG. 2A, places the P-type MOS transistor PM4, having the smallest ON resistance Rds4 and the largest parasitic capacitance Cgd4, in the ON state, and keeps the P-type MOS transistors PM1 to PM3 in an OFF state. Due to such a control, it is possible to allow the largest current to flow in the switch circuit immediately after the switch circuit is turned on. In this example, a case where the impedance of the load is low and an output current IOUT of 1 A flows is exemplified. Since the ON resistance Rds4 is 0.01Ω at this point of time, the voltage difference across the switch is 10 mV.

When the impedance of the load is increased from a state shown in FIG. 2A and an output current IOUT is decreased to 100 mA from 1 A, the voltage difference is decreased to 1 mV from 10 mV. As described previously, at this point of time, the control circuit 20 controls whether or not the respective P-type MOS transistors PM1 to PMn are made to perform an ON operation (that is, are placed in an ON state) such that the input-output ON resistance is increased and, at the same time, the sum of the parasitic capacitances of the respective P-type MOS transistors in the ON state is decreased. In this embodiment, the control circuit 20 places the P-type MOS transistor PM3 having the ON resistance Rds3 of 0.1Ω and the parasitic capacitance Cgd3 of 1,000 pF in the ON state, and does not place the P-type MOS transistors PM1, PM2, PM4 in the ON state—that is, transistors PM1, PM2, and PM4 are in the OFF state.

When the impedance of the load is further increased and an output current IOUT is decreased to 10 mA from 100 mA, the voltage difference is decreased to 1 mV from 10 mV. At this point of time, the control circuit 20, in accordance with the above-mentioned control, places the P-type MOS transistor PM2 having the ON resistance Rds2 of 1Ω and the parasitic capacitance Cgd2 of 100 pF in an ON state, and does not place the P-type MOS transistors PM1, PM3, PM4 in an ON state.

When the impedance of the load is further increased and an output current IOUT is decreased to 1 mA from 10 mA, the voltage difference is decreased to 1 mV from 10 mV. At this point of time, the control circuit 20, in accordance with the above-mentioned control, as shown in FIG. 2B, places the P-type MOS transistor PM1 having the ON resistance Rds1 of 10Ω and the parasitic capacitance Cgd1 of 10 pF in the ON state, and does not place the P-type MOS transistors PM2 to PM4 in the ON state.

Next, the operation of the switch circuit when an output current IOUT is increased at the time of turning on the switch circuit is explained.

The control circuit 20, each time the voltage difference is increased and becomes equal to a second predetermined value (for example, 11 mV) which is larger than the first predetermined value, controls whether or not the respective P-type MOS transistors PM1 to PM4 are placed in an ON state such that the input-output ON resistance of the switch circuit is increased and, at the same time, the sum of the parasitic capacitances of the respective P-type MOS transistors that are in the ON state is increased.

For example, in a state where the P-type MOS transistor PM1 shown in FIG. 2B is in an ON state, when the impedance of the load is decreased and an output current IOUT is increased to 1.1 mA, the voltage difference is increased to 11 mV. As described previously, at this point of time, the control circuit 20 controls the respective P-type MOS transistors PM1 to PMn such that the input-output ON resistance (resistance between input/output nodes) is decreased and, at the same time, the sum of the parasitic capacitances of the respective P-type MOS transistors presently in an ON state is increased. In this example, the control circuit 20 places the P-type MOS transistor PM2 having the ON resistance Rds2 of 1Ω and the parasitic capacitance Cgd2 of 100 pF in an ON state, and does not place the P-type MOS transistors PM1, PM3, PM4 in the ON state.

When the impedance of the load is further decreased and an output current IOUT is increased to 11 mA from 1.1 mA, the voltage difference between input/output nodes increases to 11 mV from 1.1 mV. At this point of time, the control circuit 20, in accordance with the above-mentioned control, places the P-type MOS transistor PM3 having ON resistance Rds3 of 0.15Ω and parasitic capacitance Cgd3 of 1,000 pF in an ON state, and does not place the P-type MOS transistors PM1, PM2, PM4 in the ON state.

When the impedance of the load is further decreased and an output current IOUT is increased to 110 mA from 11 mA, the voltage difference is increased to 11 mV from 1.1 mV. At this point of time, the control circuit 20, as shown in FIG. 2A, places the P-type MOS transistor PM4 having ON resistance Rds4 of 0.01Ω and parasitic capacitance Cgd4 of 10,000 pF in an ON state, and does not place the P-type MOS transistors PM1 to PM3 in an ON state.

Next, an operation of switching the switch circuit to an OFF state from an ON state is explained.

Figure 4A:
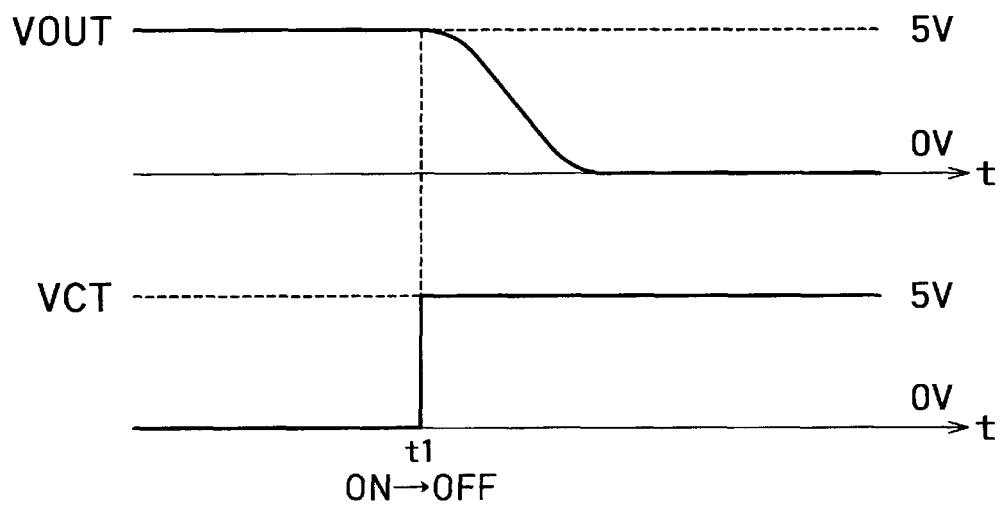
FIG. 4A is a diagram showing a control signal and an output voltage when the switch circuit according to one embodiment is switched from an ON state to an OFF state when an output current is large.
Figure 4B:
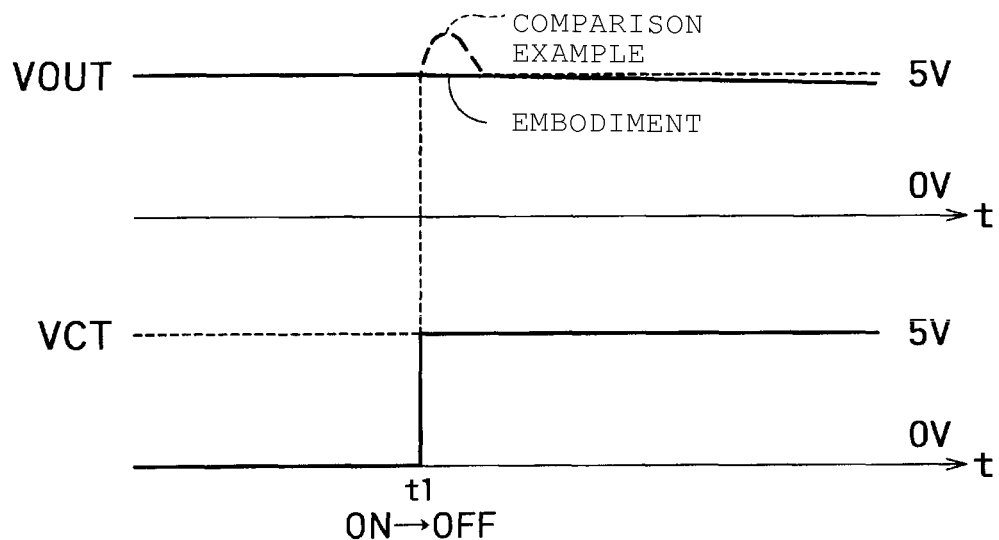
FIG. 4B is a diagram showing a control signal and an output voltage when the switch circuit is switched from an ON state to an OFF state when an output current is small.

FIG. 4A shows a control signal VCT and an output voltage VOUT when the switch circuit according to an embodiment is switched from a state (ON state) depicted in FIG. 2A to an OFF state; and FIG. 4B shows a control signal VCT and an output voltage VOUT when the switch circuit is switched from a state (ON state) depicted in FIG. 2B to an OFF state.

In the state shown in FIG. 2A, the parasitic capacitance Cgd4 of the P-type MOS transistor PM4 is 10,000 pF and hence, an electrical charge stored in the parasitic capacitance when the switch circuit is turned on (conducting) is larger than an electrical charge in the state shown in FIG. 2B.

However, as shown in FIG. 4A, when a control signal VCT becomes 5V from 0V at a point of time t1 so that the switch circuit is switched to an OFF state from an ON state, because the impedance of the load is low and an output current IOUT becomes approximately 1 A, the time required for the parasitically stored electrical charge to be discharged to the load is short even when the parasitically stored electrical charge is large. Accordingly, even when a gate voltage VG4 becomes 5V from 0V, an output voltage VOUT is not raised from the gate voltage VG4 (5V) by an amount of voltage at both ends of the parasitic capacitance Cgd4, and is decreased to 0V from 5V after the point of time t1. That is, the increase of the output voltage VOUT at the time of turning off the switch circuit can be suppressed.

Gate voltages VG1 to VG3 of the P-type MOS transistors PM1 to PM3 which are not in the ON state are held at 5V and do not change around the point of time t1 and the parasitic capacitances Cgd1 to Cgd3 are not hardly charged thus, there is no concern that the parasitic capacitances Cgd1 to Cgd3 will cause an increase in output voltage VOUT.

In the state shown in FIG. 2B, the parasitic capacitance Cgd1 of the P-type MOS transistor PM1 in the ON state is 10 pF and hence, an electrical charge charged in the parasitic capacitance when the switch circuit is turned on is smaller than an electrical charge in the state shown in FIG. 2A.

Accordingly, as shown in FIG. 4B, even when the impedance of the load is high such that an output current IOUT is approximately 1 mA when the switch circuit is switched from an ON state to an OFF state at the point of time t1, a time during which the parasitically stored electrical charge is discharged to the load is short, and is substantially equal to the time in the case shown in FIG. 4A. Accordingly, even when the gate voltage VG1 becomes 5V from 0V, the output voltage VOUT is not raised by an amount of voltage at both ends of the parasitic capacitance Cgd1 from the gate voltage VG1 (5V) and, after the point of time t1, the output voltage VOUT is monotonously decreased to 0V from 5V over a longer time than the case shown in FIG. 4A. That is, the increase of the output voltage VOUT when the switch circuit is turned off can be suppressed.

In a switch circuit of a comparison example which uses only one P-type MOS transistor without control dependent on an output current IOUT, it is necessary to use a P-type MOS transistor having low ON resistance and large parasitic capacitance substantially equal to the ON resistance of the P-type MOS transistor PM4 of this embodiment to cope with the case where the output current IOUT is approximately 1 A. Accordingly, when the impedance of the load is high and the output current IOUT is small, an electrical charge charged into the parasitic capacitance when the switch circuit is turned on is larger than a charge in this embodiment. Accordingly, the time during which the charged electrical charge is discharged to the load at the time of turning off the switch circuit becomes longer than the corresponding time in this embodiment. Accordingly, as indicated by a broken line in FIG. 4B, an output voltage VOUT is transitionally raised by an amount of voltage at both ends of the parasitic capacitance from a gate voltage (5V) and hence, the output voltage VOUT becomes larger than an input voltage VIN (5V).

According to this embodiment, the control circuit 20 controls whether or not the respective P-type MOS transistors are place in the ON state such that the sum of the parasitic capacitances of the respective P-type MOS transistors in the ON state is decreased as an output current IOUT is decreased. And when the output current IOUT is increased, the control circuit 20 controls the respective P-type MOS transistors such that the sum of the parasitic capacitances of the respective P-type MOS transistors in the ON state is increased. Accordingly, an electrical charge charged into the parasitic capacitance of the P-type MOS transistors in the ON state can be decreased as the output current IOUT is decreased. Accordingly, even when the output current IOUT is small, there is no concern that a time during which the charged electrical charge is discharged to the load at the time of turning off the switch circuit becomes long. Accordingly, the increase of the output voltage VOUT when the switch circuit is switched to an OFF state from an ON state can be suppressed regardless of a state (impedance) of the load.

The larger the number of P-type MOS transistors is, the finer the parasitic capacitance can be controlled corresponding to an output current IOUT and hence, the increase of the output voltage VOUT may be more effectively suppressed when the total number of P-type MOS transistors in the switch circuit is increased.

(Modification)

The control circuit 20 may place a plurality of P-type MOS transistors in an ON state at the same time as long as the sum of the parasitic capacitances of the respective P-type MOS transistors in the ON state is decreased as the an output current IOUT is decreased and the sum of the parasitic capacitances of the respective P-type MOS transistors in the ON state is increased as the output current IOUT is increased as described previously. For example, the control circuit 20 may decrease the number of P-type MOS transistors in the ON state as an output current IOUT is decreased, and may increase the number of P-type MOS transistors in the ON state as the output current IOUT is increased.

That is, in the examples shown in FIGS. 2A and 2B, the P-type MOS transistor PM1 may be made to perform an ON operation when an output current IOUT is 1 mA, and two P-type MOS transistors PM1, PM2 may be placed in the ON state when the output current IOUT is 10 mA. In this case, the sum of the parasitic capacitances Cgd1, Cgd2 of the respective P-type MOS transistors PM1, PM2 is 110 pF. Three P-type MOS transistors PM1 to PM3 may be place in the ON state when an output current IOUT is 100 mA. In this case, the sum of the parasitic capacitances Cgd1 to Cgd3 of the respective P-type MOS transistors PM1 to PM3 is 1,110 pF. Further, four P-type MOS transistors PM1 to PM4 may be placed in the ON state when an output current IOUT is 1 A. In this case, the sum of the parasitic capacitances Cgd1 to Cgd4 of the respective P-type MOS transistors PM1 to PM4 is 11,110 pF.

The control circuit 20 may also place the plurality of P-type MOS transistors PM1 to PMn in the ON state when a control signal VCT is switched to 0V from 5V.

The control circuit 20 may switch, as shown in FIG. 2B, the P-type MOS transistor PM1 having the largest ON resistance Rds1 and the smallest parasitic capacitance Cgd1 to an ON state and place the P-type MOS transistors PM2 to PM4 in an OFF state when a control signal VCT is switched to 0V from 5V.

In some embodiments, the ON resistances of the respective P-type MOS transistors may be equal and gate-drain parasitic capacitances of the respective P-type MOS transistors may be equal rather than having different values. That is, the respective P-type MOS transistors may be set equal in size rather than having different sizes. The control circuit 20 may thus perform a control such that the number of P-type MOS transistors which are made to perform an ON operation as an output current IOUT is decreased, and may increase the number of P-type MOS transistors which are made to perform an ON operation as the output current IOUT is increased. Thus, control can be based on the number of P-type MOS transistor placed in the ON-state rather than on the specific sizes (or other properties) of different P-type MOS transistors as described in the first embodiment.

Further, switching elements such as insulated-gate bipolar transistors (IGBTs) may be used in place of the P-type MOS transistors PM1 to PMn.

The detection circuit 10 may detect an output voltage VOUT in addition to an output current IOUT, and may detect the impedance of a load based on these values.

These modifications can also realize substantially the same advantageous effects as the above-mentioned embodiments.

According to the embodiment explained heretofore, with the provision of the plurality of P-type MOS transistors PM1 to PMn and the control circuit 20, it is possible to suppress the increase of an output voltage VOUT when a switch circuit is switched to an OFF state from an ON state regardless of a state of a load.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A switch circuit, comprising:
   a plurality of switching elements, including first, second, and third switching elements, each switching element connected between an input node and an output node and including:
   a first electrode connected to the input node;
   a second electrode connected to the output node; and
   a control electrode which controls electrical conductance between the first electrode and the second electrode such that the switching element can be switched between an ON state and an OFF state, the first switching element having a greater on-state resistance and a greater parasitic capacitance than those of the second switching element, and the second switching element having a greater on-site resistance and a greater parasitic capacitance than those of the third switching element;

a detection circuit configured to output a detection value corresponding to a voltage difference between a voltage at the input node and a voltage at the output node; and a control circuit configured to switch the first switching element to the OFF state and the second switching element to the ON state such that only the second switching element is placed in the ON state among the plurality of switching elements when the detection value decreases to a first predetermined value, and then switch the second switching element to the OFF state and the third switching element to the ON state such that only the third switching element is placed in the ON state among the plurality of switching elements, when the detection value decreases to the first predetermined value again, each of the parasitic capacitances of the switching elements being equal to a parasitic capacitance between the control electrode of the respective switching element and the second electrode of the respective switching element.

2. The switch circuit according to claim 1, wherein each switching element in the plurality of switching elements comprises a P-type MOS transistor with a size that is different from each other.

3. The switch circuit according to claim 1, wherein each switching element in the plurality of switching elements is a P-type MOS transistor, the first electrode is a source terminal of the P-type MOS transistor, the second electrode is a drain terminal of the P-type MOS transistor, and the control electrode is a gate terminal of the P-type MOS transistor.

4. The switch circuit according to claim 1, wherein the plurality of switching elements comprises insulated gate bipolar transistors.

5. The switching circuit according to claim 1, wherein the control circuit is further configured to switch the second switching element to the ON state and the third switching element to the OFF state such that only the second switching element is placed in the ON state among the plurality of switching elements when the detection value increases to a second predetermined value that is larger than the first predetermined value.

6. A switch circuit, comprising:

a control circuit configured to control a plurality of switching elements connected between an input node and an output node, the plurality of switching elements including first, second, and third switching elements, each switching element including:

a first electrode connected to the input node;

a second electrode connected to the output node; and a control electrode configured to receive switching signals from the control circuit to change an electrical conductance between the first electrode and the second electrode such that the switching element can be switched between an ON state and an OFF state; and a detection circuit configured to output a detection value corresponding to an output current at the output node, wherein the control circuit is configured to switch the first switching element to the OFF state and the second switching element to the ON state such that only the second switching element is placed in the ON state among the plurality of switching elements when the detection value decreases to a first predetermined value, and then switch the second switching element to the OFF state and the third switching element to the ON state such that only the third switching element is placed in the ON state among the plurality of switching elements, when the detection value decreases to the first predetermined value again, each of the parasitic capacitances of the switching elements being equal to a parasitic capacitance between the control electrode of the respective switching element and the second electrode of the respective switching element.

7. The switching circuit of claim 6, wherein the control circuit is configured to receive a switch control signal from the outside and to place all switching elements in the ON state when the switch control signal is at predetermined level.

8. The switching circuit of claim 6, wherein the switching elements each comprise a P-type MOS transistor.

9. A method of controlling a switching circuit including a plurality of switching elements connected in parallel between an input node and an output node, the plurality of switching elements including first, second, and third switching elements, the method comprising:

detecting a detection value corresponding to an output current at the output node;

switching the first switching element to the OFF state and the second switching element to the ON state such that only the second switching element is placed in the ON state among the plurality of switching elements when the detection value decreases to a first predetermined value; and then switching the second switching element to the OFF state and the third switching element to the ON state such that only the third switching element is placed in the ON state among the plurality of switching elements, when the detection value decreases to the first predetermined value again, each of the parasitic capacitances of the switching elements being equal to a parasitic capacitance between a control electrode of the respective switching element and a drain electrode of the respective switching element.

* * * * *